US008811076B2

(12) United States Patent
Venkitachalam et al.

(10) Patent No.: US 8,811,076 B2
(45) Date of Patent: Aug. 19, 2014

(54) SYSTEMS AND METHODS OF UPDATING READ VOLTAGES

(75) Inventors: Anand Venkitachalam, Bangalore (IN); Sateesh Desireddi, Andhra Pradesh (IN); Jayaprakash Naradasi, Bangalore (IN); Manuel Antonio D'Abreu, El Dorado Hills, CA (US); Stephen Skala, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/599,854

(22) Filed: Aug. 30, 2012

(65) Prior Publication Data

US 2014/0029336 A1 Jan. 30, 2014

(30) Foreign Application Priority Data

Jul. 30, 2012 (IN) .......................... 3113/CHE/2012

(51) Int. Cl.
*G11C 11/34* (2006.01)
*G11C 16/04* (2006.01)
*G11C 16/34* (2006.01)
*G11C 29/02* (2006.01)

(52) U.S. Cl.
CPC ............ *G11C 16/349* (2013.01); *G11C 29/021* (2013.01)
USPC .............. 365/185.03; 365/185.02; 365/185.2; 365/185.09

(58) Field of Classification Search
CPC .... G11C 16/349; G11C 16/26; G11C 29/021; G11C 29/42
USPC ................. 365/185.02, 185.03, 185.2, 185.09
See application file for complete search history.

(56) References Cited

U.S. PATENT DOCUMENTS

| | | | |
|---|---|---|---|
| 6,233,201 B1 * | 5/2001 | Sone ............................. | 365/241 |
| 7,135,890 B2 | 11/2006 | Chang | |
| 7,751,237 B2 | 7/2010 | Alrod et al. | |
| 7,764,543 B2 | 7/2010 | Cho et al. | |
| 7,903,468 B2 | 3/2011 | Litsyn et al. | |
| 7,911,834 B2 | 3/2011 | Cornwell et al. | |
| 7,941,590 B2 | 5/2011 | Yang et al. | |
| 8,027,196 B1 | 9/2011 | Wong | |

(Continued)

OTHER PUBLICATIONS

Desireddi, Sateesh, "Systems and Methods of Updating Read Voltages", U.S. Appl. No. 13/523,680, filed Jun. 14, 2012, 31 pages.

(Continued)

*Primary Examiner* — Ly D Pham
(74) *Attorney, Agent, or Firm* — Toler Law Group, PC (57) ABSTRACT

A method includes, in a data storage device that includes a non-volatile memory, selecting an updated reference voltage as one of a reference voltage, a first alternate reference voltage and a second alternate reference voltage. The first alternate reference voltage and the second alternate reference voltage are calculated based on the reference voltage and based on a voltage increment. Selection of the updated reference voltage is based on a comparison of error counts, each error count associated with a unique one of the reference voltage, the first alternate reference voltage, and the second alternate reference voltage. The method includes resetting the reference voltage to the updated reference voltage, resetting the voltage increment to a reset voltage increment that is smaller than the voltage increment, and selecting an additional updated reference voltage based on the reset reference voltage and based on the reset voltage increment.

23 Claims, 5 Drawing Sheets

(56) References Cited

U.S. PATENT DOCUMENTS

| | | | |
|---|---|---|---|
| 8,040,737 B2 | 10/2011 | Alrod et al. | |
| 8,095,851 B2 | 1/2012 | Diggs et al. | |
| 8,327,229 B2 | 12/2012 | Noguchi | |
| 8,503,237 B1 * | 8/2013 | Horn | 365/185.09 |
| 8,510,637 B2 | 8/2013 | Tseng et al. | |
| 8,578,245 B2 | 11/2013 | Yeh et al. | |
| 8,601,313 B1 | 12/2013 | Horn | |
| 8,638,602 B1 | 1/2014 | Horn | |
| 2004/0123207 A1 * | 6/2004 | Zumkehr et al. | 714/744 |
| 2009/0003058 A1 * | 1/2009 | Kang | 365/185.03 |
| 2009/0154250 A1 * | 6/2009 | Lin | 365/185.22 |
| 2010/0020611 A1 | 1/2010 | Park | |
| 2010/0290287 A1 * | 11/2010 | Arussi | 365/185.11 |
| 2010/0332923 A1 | 12/2010 | d'Abreu et al. | |
| 2011/0096612 A1 | 4/2011 | Steiner et al. | |
| 2011/0182119 A1 | 7/2011 | Strasser et al. | |
| 2011/0228604 A1 * | 9/2011 | Eli et al. | 365/185.09 |
| 2012/0079353 A1 | 3/2012 | Liikanen et al. | |
| 2012/0284587 A1 * | 11/2012 | Yu et al. | 714/773 |
| 2013/0094286 A1 * | 4/2013 | Sridharan et al. | 365/185.2 |

OTHER PUBLICATIONS

Desireddi, Sateesh, "Systems and Methods to Initiate Updating of Reference Voltages", U.S. Appl. No. 13/630,686, filed Sep. 28, 2012, 29 pages.

Non-Final Office Action mailed Apr. 2, 2014 in U.S. Appl. No. 13/630,686, 6 pages.

* cited by examiner

SYSTEMS AND METHODS OF UPDATING READ VOLTAGES

CLAIM OF PRIORITY

The present application claims priority from Indian Patent Application No. 3113/CHE/2012 filed on Jul. 30, 2012, which is incorporated herein in its entirety.

FIELD OF THE DISCLOSURE

The present disclosure is generally related to updating reference voltages in a data storage device.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in a data storage device have been programmed, data may be read from the memory cells by sensing the programmed state of each memory cell by comparing the cell threshold voltage to one or more reference voltages. However, the sensed programming states can sometimes vary from the written programmed states due to one or more factors, such as data retention and program disturb conditions.

SUMMARY

Accuracy of reading data stored in a data storage device may be improved by updating a set of reference voltages to reduce a count of errors associated with reading the stored data. A selection of an updated reference voltage from a reference voltage, a first alternate reference voltage, and a second alternate reference voltage may be made based on a comparison of error counts of read errors associated with each of the reference voltage, the first alternate reference voltage, and the second alternate reference voltage. The first alternate reference voltage and the second alternate reference voltage may be calculated based on the reference voltage and based on a voltage increment. After selecting the updated reference voltage, the reference voltage may be reset to the updated reference voltage and the voltage increment may be reset to a smaller voltage increment. After resetting the reference voltage and the voltage increment, selection of a further updated reference voltage may be performed using the reset reference voltage and the smaller voltage increment.

DETAILED DESCRIPTION

A programmed state of a particular memory element of a data storage device may change over time due to various factors, such as time-related degradation of memory, program disturb factors, and other proximity-related factors. A cell voltage distribution of the data storage device may change over time depending on various parameters including a time elapsed since program, a temperature, a geometry (e.g., die/block/word line), and a number of program and erase cycles, as illustrative examples.

The programmed state of the each data element is typically determined by sensing a memory element threshold voltage using one or more reference voltages. The reference voltage that correctly senses the memory element threshold voltage may change over time as the threshold voltage of the memory element changes. As a result, use of a fixed reference voltage may result in errors in data values read from memory elements whose threshold voltages have changed over time. In order to maintain reliability and performance of a data storage device, it may be beneficial for a memory controller of the data storage device to update values of reference voltages used to read the data storage device.

Improved error correction capability of data stored in a memory of a data storage device may be achieved with reduced latency by updating reference voltage values based on a comparison of error counts. Systems and methods of updating each reference voltage of a set of reference voltages by comparing an error count associated with each reference voltage to corresponding error counts associated with alternate reference voltages in an iterative selection process are disclosed.

Figure 1:
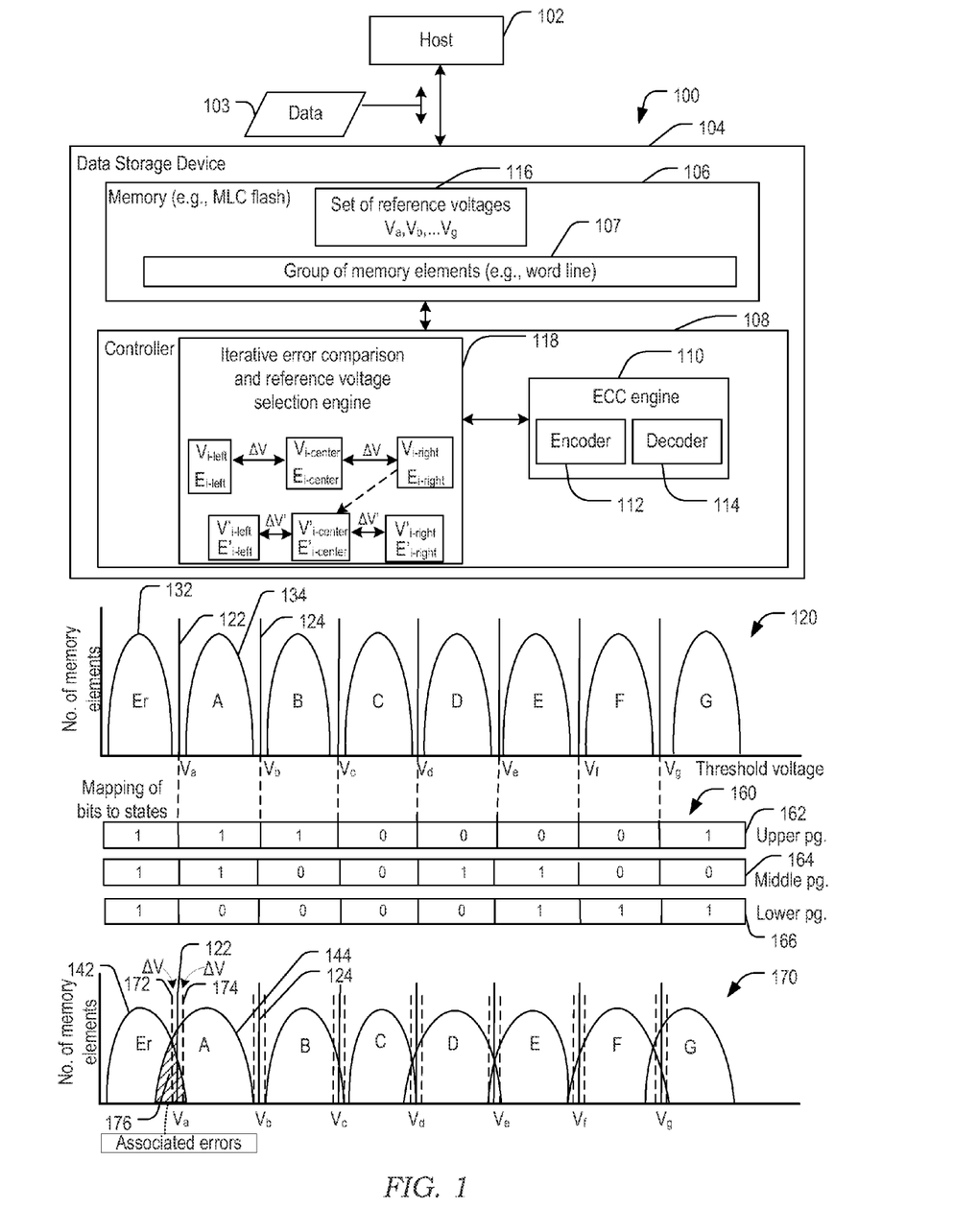
FIG. 1 is a general diagram of a first illustrative embodiment of a system including a data storage device configured to update a reference voltage based on a comparison of an error counts associated with each of the reference voltage, a first alternate reference voltage, and a second alternate reference voltage, and FIG. 1 graphically illustrates read errors due to overlapping of states of memory elements.

Referring to FIG. 1, a particular illustrative embodiment of a system 100 includes a data storage device 104 that is configured to update reference voltages by successive iterations and that is coupled to a host device 102. The data storage device 104 includes a memory 106 coupled to a controller 108. The data storage device 104 is configured to enable exchange of data, such as data 103, between the host device 102 and the memory 106 of the data storage device 104.

The host device 102 may be configured to provide data to be stored at the memory 106 or to request data to be read from the memory 106. For example, the host device 102 may include a mobile telephone, a music or video player, a gaming console, an electronic book reader, a personal digital assistant (PDA), a computer such as a laptop computer, a notebook computer, or a tablet, any other electronic device, or any combination thereof.

The data storage device 104 may be a memory card, such as a Secure Digital SD® card, a microSD® card, a miniSD® card (trademarks of SD-3C LLC, Wilmington, Del.), a MultiMediaCard® (MMC®) card (trademark of JEDEC Solid State Technology Association, Arlington, Va.), or a CompactFlash® (CF) card (trademark of SanDisk Corporation, Milpitas, Calif.). As another example, the data storage device 104 may be embedded memory in the host device 102, such as eMMC® (trademark of JEDEC Solid State Technology Association, Arlington, Va.) memory and eSD memory, as illustrative examples.

The memory 106 may be a non-volatile memory of a flash device, such as a NAND flash device, a NOR flash device, or any other type of flash device. The memory 106 may include a group of memory elements 107. For example, the group of memory elements 107 may include a word line. Each memory element in the group of memory elements 107 may be a memory cell of a multi-level cell (MLC) memory.

Each memory element may have an associated threshold voltage corresponding to a state of the memory element. Each state may correspond to a particular range of threshold voltage values, such as depicted in a graph 120. The state of each memory element represents data stored at the memory element, such as according to a mapping 160 of bits to states of the memory element. The data stored at the memory element may be read by comparing the threshold voltage of the memory element to one or more reference voltages of a set of reference voltages 116 including reference voltages $V_a, V_b, \ldots V_g$ that are stored in the memory 106. The set of reference voltages 116 may be used to sense the state of each of the memory elements of the group of memory elements 107.

The controller 108 may include an error correction code (ECC) engine 110. The ECC engine 110 may include an ECC encoder 112 and an ECC decoder 114. The ECC encoder 112 may be configured to encode data with error correction information. The ECC decoder 114 may be configured to decode the error correction information of data read from the memory 106 to correct errors in the data, up to an error correction capability of the ECC decoder 114.

The controller 108 may be configured to determine a read point error count (e.g., $E_a$) that is associated with a reference voltage (e.g., $V_a$). The read point error may be associated with a data read from memory storage elements of the memory 106. The controller 108 may be configured to iteratively reset the reference voltage in a plurality of iterations. Each reset reference voltage (e.g., $V'_a$) may be associated with an updated read point error count (e.g., $E'_a$) and each reset reference voltage may be selected based on read point error counts of multiple candidate reference voltages (e.g., $V_{a\text{-}left}$, $V_a$, $V_{a\text{-}right}$). A voltage range (e.g., from $V_{a\text{-}left}$ to $V_{a\text{-}right}$) of the multiple candidate reference voltages ($V_{a\text{-}left}$, $V_a$, $V_{a\text{-}right}$) may decrease with each successive iteration. For example, the controller 108 may be configured to determine a read point error count $E_{i\text{-}center}$ associated with a reference voltage $V_{i\text{-}center}$, the read point error count $E_{i\text{-}center}$ associated with a data read from the group of memory elements 107 within the memory 106.

To illustrate, the controller 108 includes an iterative error comparison and reference voltage engine 118. The iterative error comparison and reference voltage engine 118 may be configured to update each reference voltage $V_i$ (i=a, b, c, ... g) by selecting, for each i (i=a, b, ... g), an updated reference voltage ($V'_{i\text{-}center}$) from one of the reference voltage $V_i$, a first alternate reference voltage $V_{i\text{-}left}$ (=$V_i-\Delta V$) (e.g., situated to the left of $V_i$ on the graph 120) and a second alternate reference voltage $V_{i\text{-}right}$ (=$V_i+\Delta V$) (e.g., situated to the right of $V_i$), based on a comparison of read point error counts $E_{i\text{-}center}$, $E_{i\text{-}left}$, and $E_{i\text{-}right}$, each of which is associated with a unique one of $V_i$, $V_{i\text{-}left}$, and $V_{i\text{-}right}$. A next iteration of updating of the reference voltages $V_i$ (i=a, b, c, ..., g) may be conducted to select an additional updated reference voltage based on a reset reference voltage $V'_{i\text{-}center}$ and based on a reset voltage increment $\Delta V'$ that is less than $\Delta V$ (e.g., $\Delta V/2$). For example, a next iteration of updating the reference voltages $V_i$ (i=a, b, c, ... g) may be conducted by reading memory elements using each of the reference voltage sets $V_i$ (after resetting each $V_i$ to $V'_{i\text{-}center}$), $V_{i\text{-}left}$ (after resetting each $V_{i\text{-}left}$ to $V'_{i\text{-}center}-\Delta V'$), and $V_{i\text{-}right}$ (after resetting each $V_{i\text{-}right}$ to $V_{i\text{-}center}+\Delta V'$) (i=a, b, ... g). For each i, the additional updated reference voltage ($V''_{i\text{-}center}$) may be selected by comparing associated read point error counts $E_{i\text{-}center}$, $E_{i\text{-}left}$, and $E_{i\text{-}right}$ (i=a, b, ... g), i.e., selecting the reference voltage having the smallest associated error count to be the additional updated reference voltage ($V''_{i\text{-}center}$).

Graph 120 is a histogram illustrating a count of memory elements within a memory, such as the memory 106, vs. threshold voltage of the memory elements. For instance, the memory 106 may include multi-level cells (MLCs), each MLC capable of storing data and each MLC having a threshold voltage corresponding to a data value of the stored data. In a particular embodiment, each of the MLC memory elements has a total of eight states into which the MLC memory element may be programmed. The eight states can be represented by three bits, illustrated in the mapping 160 as a first bit in an upper page 162, a second bit in a middle page 164, and a third bit in a lower page 166.

A first histogram curve 132 illustrates a distribution of memory elements of the group of memory elements 107 having a threshold voltage that is less than the reference voltage $V_a$ 122. Each memory element represented in the curve 132 is programmed to a state corresponding to a data value of 1 1 1, e.g., an "Erase state," or "Er," corresponding to a "1" bit in the upper page 162, a "1" bit in the middle page 164, and a "1" bit in the lower page 166.

A second histogram curve 134 represents a distribution of memory elements of the group of memory elements 107 having corresponding threshold voltages between voltage $V_a$ 122 and voltage $V_b$ 124. Each of these memory elements is programmed to a state corresponding to a data value of 1 1 0 (e.g., state "A" corresponding to a "1" bit in the upper page 162, a "1" bit in the middle page 164, and a "0" bit in the lower page 166.) In a similar fashion, each curve in the graph 120 lies between two reference voltages and represents memory elements that are programmed to threshold voltages corresponding to a data value as shown in the mapping 160. Each memory element in the group of memory elements 107 stores a data value corresponding to its programmed state, and the corresponding data value can be found in the mapping 160.

When the data is initially stored in the group of memory elements 107, each of the curves depicted in the graph 120 is illustrated as lying entirely between two reference voltages (e.g., the curve 132 lies entirely below reference voltage $V_a$ 122, and the curve 134 lies entirely between reference voltages $V_a$ 122 and $V_b$ 124). When the data stored in the group of memory elements 107 is read immediately following storage of the data, there may be no errors to be corrected by the ECC decoder 114. Because the curve 134 lies between two corresponding reference voltages, all memory elements represented in the curve 134 are read as storing the same value (e.g., all elements represented in the curve 134 store the value 1 1 0) and the ECC decoder 114 detects no errors in the sensed data. All memory elements of a curve are initially programmed to the same state. Although each of the curves depicted in the graph 120 is illustrated as lying entirely between two reference voltages for clarity of explanation, under some conditions the programming of data may instead result in one or more of the curves not lying entirely between two reference voltages.

The programmed state of a particular data element is reflected in the threshold voltage, and the threshold voltage may change over time due to various time-driven factors and proximity-related factors. An example of changing threshold voltages is illustrated in a graph 170. A curve 142 represents the memory elements that were initially depicted in the curve 132 of the graph 120, where the curve 132 has changed shape over time to become the curve 142. A portion of the curve 142 appears to the right of the reference voltage $V_a$ 122 and represents memory elements originally programmed to state Er but have been disturbed to have threshold voltages greater than $V_a$ 122. All memory elements to the right of the reference voltage $V_a$ 122 will be read to have a value of 1 1 0 (as shown in the mapping 160) instead of the value of 1 1 1 that was originally stored. Memory elements that have been programmed to store 1 1 1 but that are read as storing the 1 1 0 value introduce an error in the lower page 166 that is reflected in an associated error count.

Curve 144 represents a histogram of memory elements for which the stored data value was 1 1 0, initially determinable from the reference voltages $V_a$ 122 and $V_b$ 124. That is, when the data was initially stored in the memory elements and represented by the curve 134 of the graph 120, the stored value of the data was 1 1 0, determined through use of the reference voltages $V_a$ 122 and $V_b$ 124. However, over time, the curve 134 has changed shape to become the curve 144. The curve 144 crosses over the reference voltage $V_a$ 122. As a result, some of the memory elements within the curve 144 that had been initially programmed to 1 1 0 no longer appear between the reference voltages $V_a$ 122 and $V_b$ 124. A portion of the curve 144 to the left of reference voltage $V_a$ 122 represents memory elements that may be read as having a stored value of 1 1 1, according to the mapping 160, instead of the originally stored value of 1 1 0. Thus, over time, the read values of some of the memory elements may be incorrect and may be counted as errors by the ECC decoder 114.

When the reference voltages of the set of reference voltages 116 are kept at their original values $V_a$ 122, $V_b$ 124, etc., reading the data values after a certain amount of time has passed may result in more errors in the read data values than if the set of reference voltages is updated. For example, a shaded area 176 (i.e., sum of areas under curves 142 and 144 extending beyond the original reference voltage $V_a$ 122) represents errors in values of data read using the original reference voltages $V_a$ 122, $V_b$ 124, etc. as a result of the curves 142 and 144 having shapes that are different than their respective original curves 132 and 134.

In a particular embodiment, the reference voltage $V_a$ 122 may be replaced by a first alternate reference voltage 172 that differs from the reference voltage $V_a$ 122 by an offset voltage $\Delta V$. For example, a (dashed) vertical line representing the first alternate reference voltage 172 may intersect the crossing point of the curves 142 and 144. A portion of the curve 142 lies to the right of the first alternate reference voltage 172, and a portion of the curve 144 lies to the left of the first alternate reference voltage 172. The sum of the areas of these portions is a measure of the error count associated with the first alternate reference voltage 172. There may a smaller error count associated with first alternate reference voltage 172 than the error count associated with the reference voltage 122. Typically a reference voltage (represented by a first straight line) that does not pass through the intersection of two adjacent histogram curves has an associated error count that is larger than a second reference voltage (represented by a second straight line) that passes through the intersection of the two adjacent histogram curves.

Considering a second alternate reference voltage 174, a first region (of the curve 142) is right of the second alternate reference voltage 174 and a second region (of the curve 144) is left of the second alternate reference voltage 174. The sum of the areas of first region and the second region corresponds to the error count associated with the second alternate reference voltage 174. Of the three voltages 122, 172, and 174, the first alternate reference voltage 172 is closest to the intersection of curves 142 and 144, and therefore typically has the smallest associated error count.

By updating each reference voltage $V_a$, $V_b$, etc., the count of read errors associated with each reference voltage may be reduced. Each of the first alternate reference voltage and the second alternate reference voltage may be calculated by subtracting from the reference voltage, or adding to the reference voltage, the same offset voltage $\Delta V$ (i.e., using a same value of $\Delta V$) or by subtracting or adding different offset voltages (i.e., using different values of $\Delta V$ to calculate each of the first alternate reference voltage and the second alternate reference voltage). By comparing the error count of data read errors associated with the reference voltage $V_a$ 122 with the error count of data read errors associated with the first alternate reference voltage 172 and with the error count of data read errors associated with the second alternate reference voltage 174, a selection of an updated reference voltage may be made that has a smaller error count of data errors than the error count of data read errors associated with the reference voltage $V_a$ 122.

During operation, the controller 108 may be configured to initiate the reference voltage update using the iterative error comparison and reference voltage selection engine 118. The iterative error comparison and reference voltage selection engine 118 may initiate or iterate a process to read first data values from the group of memory elements 107 using the set of reference voltages 116 and to determine an error count associated with a reference voltage 122 of the set of reference voltages 116. The controller 108 may be configured to associate each error identified in the first data values with a corresponding reference voltage of the set of reference voltages 107. The controller 108 may be configured to read first alternate data values from the group of memory elements 107 using a set of first alternate reference voltages and determine a first alternate error count associated with a first alternate reference voltage 172, to read second alternate data values from the group of memory elements 107 using a set of second alternate reference voltages, and to determine a second alternate error count associated with a second alternate reference voltage 174. The controller 108 may be further configured to create an updated set of reference voltages that includes the reference voltage 122, the first alternate reference voltage 172, or the second alternate reference voltage 174, based on a comparison of error counts, each error count associated with a unique one of the reference voltage 122, the first alternate reference voltage 172, and the second alternate reference voltage 174. A selection of the updated reference voltage, i.e., one of the reference voltage 122, the first alternate reference voltage 172, and the second reference voltage 174 may correspond to the smallest of associated error counts. Of the three voltages being compared, typically the voltage closest to the intersection of two intersecting histogram curves has the smallest associated error count. After selecting the updated reference voltage and resetting the reference voltage to the updated reference voltage, the iterative error comparison and reference voltage selection engine 118 may adjust the voltage increment $\Delta V$ and repeat the read, compare, and select process to further refine selection of the updated reference voltage to reduce errors, as described in further detail with respect to FIGS. 2, 3, and 4.

For example, using the reference voltage that has been reset to the updated reference voltage, the iterative error comparison and reference voltage selection 118 may determine a next iteration first alternate reference voltage with respect to the reset reference voltage (e.g., by subtracting an updated voltage increment from the reset reference voltage) and a next iteration second alternate reference voltage with respect to the reset reference voltage (e.g., by adding the updated voltage increment to the reset reference voltage). In an example, for each iteration an iterated voltage increment may be one-half of the voltage increment of the previous iteration so as to further refine the update reference voltage within a window of values of the reference voltage. By reading the stored data using the reset reference voltage, the first alternate reset reference voltage, and the second alternate reset reference voltage, associated error counts may be determined. A second updated reference voltage may be selected based on corresponding error counts, e.g., the smallest of the error counts. Iterations may continue until the iterated voltage increment has a smaller value than a voltage increment threshold. For example, the voltage increment for a sequence of iterations may be determined as $\Delta V$, $\Delta V/2$, $\Delta V/4$, etc., until an $N^{th}$ iteration, where $\Delta V/2^N$ is less than the voltage increment threshold.

The iterative error comparison and reference voltage selection engine 118 may be implemented using a microprocessor or microcontroller programmed to generate control information and to create an updated set of reference voltages by reading a first set of data using a set of reference voltages (e.g., $V_{i\text{-}center}$) and determining a read point error count (e.g., $E_{i\text{-}center}$) associated with each reference voltage, reading a second set of data using first alternative reference voltages (e.g., $V_{i\text{-}left}$) and determining a read point error count (e.g., $E_{i\text{-}left}$) associated with a each of the first alternative reference voltages, and reading a third set of data using second alternative reference voltages (e.g., $V_{i\text{-}right}$) and determining a read point error count (e.g., $E_{i\text{-}right}$) associated with each of the second alternative reference voltages. After reading the data, each updated reference voltage may be determined by selecting the reference voltage ($V_{i\text{-}center}$), the first alternative reference voltage ($V_{i\text{-}left}$), or the second reference voltage ($V_{i\text{-}right}$) to be included in the updated set of reference voltages based on a comparison of the read point error counts ($E_{i\text{-}center}$, $E_{i\text{-}left}$, $E_{i\text{-}right}$), each read point error count associated with a unique one of the reference voltage ($V_{i\text{-}center}$), the first alternative reference voltage ($V_{i\text{-}left}$), and the second alternative reference voltage ($V_{i\text{-}right}$). In a particular embodiment, the controller 108 includes a processor that executes instructions that are stored at the memory 106. Alternatively, or in addition, instructions that are executable by the processor may be stored at a separate memory location that is not part of the memory 106, such as at a read-only memory (ROM).

In a particular embodiment, the data storage device 104 may be a portable device configured to be selectively coupled to one or more external devices. For example, the data storage device 104 may be a removable device such as a universal serial bus (USB) flash drive or a removable memory card. However, in other embodiments, the data storage device 104 may be attached or embedded within one or more host devices, such as within a housing of a portable communication device. For example, the data storage device 104 may be within a packaged apparatus, such as a wireless telephone, a personal digital assistant (PDA), a gaming device or console, a portable navigation device, a computer, or other device that uses internal non-volatile memory. In a particular embodiment, the data storage device 104 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

As depicted in FIG. 1 for a 3-bit per cell (BPC) MLC memory, the set of reference voltages 116 may include seven reference voltages. For example, the seven reference voltages may be $V_i$ (i=a, ... g), as in graphs 120 and 170. Each memory element of the group of memory elements 107 of FIG. 1 may store three bits, as shown in the mapping 160 of FIG. 1. However, in other embodiments, there may be 2 bits per cell (3 reference voltages), 4 bits per cell (15 reference voltages), or a different number of bits per cell.

An updated set of reference voltages may result in reduced errors associated with read data. Reduced errors may result in a longer useful life of the data storage device 104. Additionally, the reduction in errors due to use of the updated set of references in reading the stored data may result in reduced processing at the ECC decoder 114, which may result in reduced read latency experienced by the host device 102.

Figure 2:
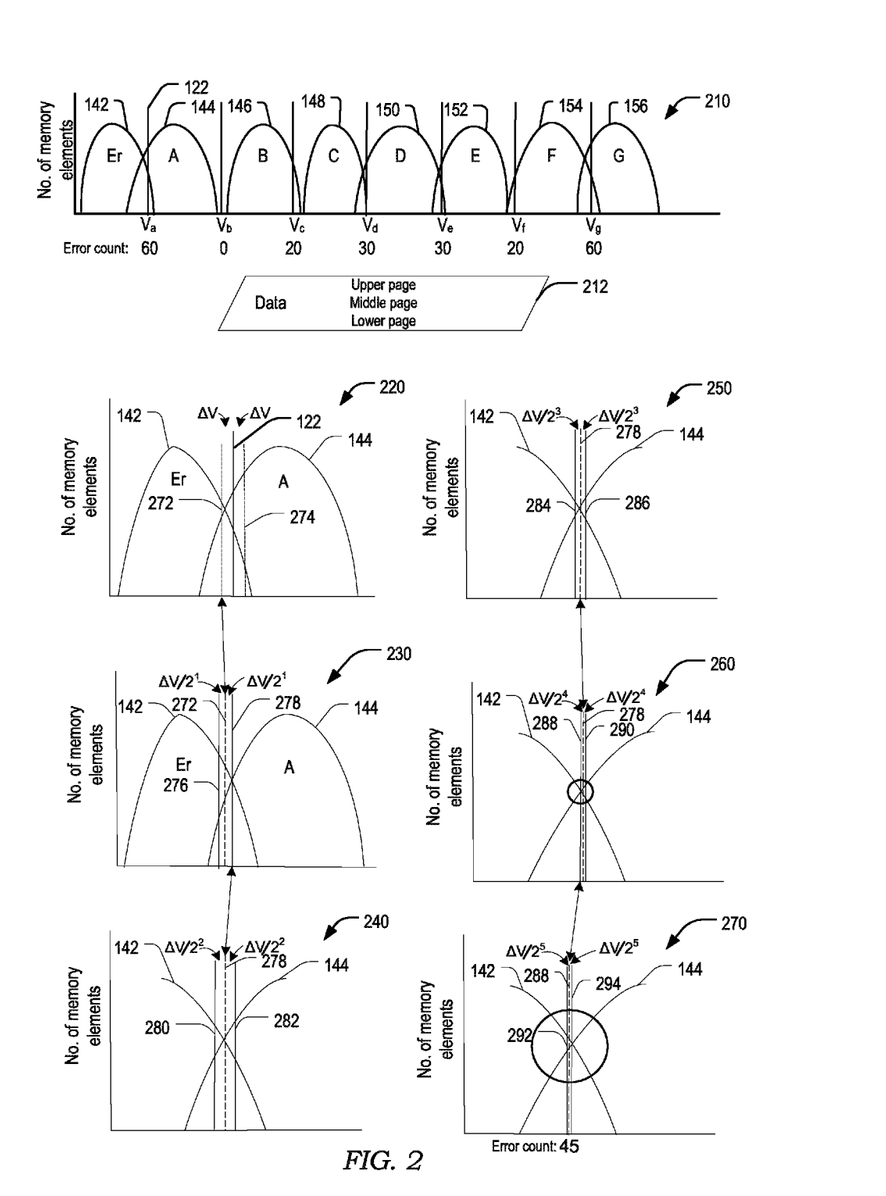
FIG. 2 is general diagram of a particular embodiment of a sensing scheme and includes a graphical depiction of a cell voltage distribution for states (Er, A, . . . G) of a multi-bit storage element of a memory of the data storage device of FIG. 1 and provides an illustration of updating the reference voltage by successive iteration.

FIG. 2 is a diagram of a particular embodiment of a sensing scheme and includes a graphical depiction of a cell voltage distribution in a memory including multi-level storage elements. A graph 210, corresponding to the graph 170 of FIG. 1, depicts a histogram showing a number of memory elements versus threshold voltage. Each of the curves 142, 144, 146, 148, 150, 152, 154, and 156 corresponds to a particular originally stored data value. For example, the memory elements represented by the curve 142 were originally programmed with the threshold voltage corresponding to the data value 1 1 1, illustrated as the curve 132 of FIG. 1. Over time, the curve 132 of FIG. 1 changed to the curve 142.

Curve 144 corresponds to storage elements originally programmed to store the data value 110 (i.e., state A, according to the mapping 160 of FIG. 1). Similarly, the memory elements of each of the curves 146-156 have been programmed to a particular threshold voltage and corresponding stored data value, and each of the curves 142-156 in the graph 210 represents a distribution of threshold voltages that has changed from a corresponding curve of the graph 120 of FIG. 1.

Curves 142-146 and 150-156 include portions that cross over a reference voltage. For instance, the curve 142 has a portion that lies to the right of the reference voltage $V_a$ 122 and another portion that lies to the left of the reference voltage $V_a$ 122. However, each of the memory elements represented by the curve 142 was originally programmed to store the data value 1 1 1 (i.e., the curve 132 is entirely to the left of the reference voltage $V_a$ 122.) Hence, there will be errors in the read values (read by comparing a storage element's threshold voltage to the reference voltage $V_a$ 122) of the data stored in some of the memory elements represented by the curve 142. Similarly, there will be errors in the read values of the data stored in some of the memory elements represented by the curves 144-146 and 150-156, because each of these curves crosses a reference voltage of the original set of reference voltages $V_a$-$V_g$. Curve 148 lies entirely between the reference voltages $V_c$ and $V_d$, as originally programmed. Therefore, there will be no errors in the read data for memory elements represented by the curve 148.

Data 212 may be read from the memory 106 by the controller 108 of FIG. 1 and the read data may be output as an upper page, a middle page, and a lower page. For example, an initial portion of an output data stream may be the upper page, which is a stream of 1s and 0s that includes the uppermost bit extracted from the three-bit values read from each of the memory elements. That is, for each memory element, only the uppermost bit of the corresponding data value will be included in the upper page (i.e., each bit in the upper page 162 of FIG. 1 of the read data value of a memory element). A second portion of the output data stream is the middle page 164 that includes, for each memory element, the middle bit of the three-bit data value of each of the memory elements. A third portion of the output data stream includes a lower page 166 that corresponds to the lowest bit of the three-bit data value of each of the memory elements. Each of the upper, middle, and lower pages may include an ECC code word that is decoded independently of the other pages.

The ECC decoder 114 of FIG. 1 may determine a count of errors associated with the upper page 162 of the read data 212. In the mapping 160 of FIG. 1, there are only two transitional points in the upper page coding. That is, there are only two positions along the upper page of the mapping 160 where the value changes from 1 to 0 or from 0 to 1, corresponding to reference voltages $V_c$ and $V_g$. By receiving the read value of each of the memory elements, it is possible to determine whether the most likely point of transition associated with the error(s) in the upper page reported by the ECC decoder 114 of FIG. 1 is at $V_c$ or $V_g$. Thus, a total error count of the readout of the upper page of the group of memory elements, and the read data value, is sufficient information to select a particular point of transition in the upper page 162 of the mapping 160 associated with the errors. Specifically, a memory element that has an error in its upper page bit and that stores a "0" value in its lower page bit is most likely in state B (i.e., 1 0 0) or state C (i.e., 0 0 0) and the upper page error of the memory element is associated with reference voltage $V_c$. Similarly, a memory element that has an error in its upper page bit and that stores a "1" value in its lower page bit is most likely in state F (i.e., 0 0 1) or state G (i.e., 1 0 1) and the upper page error of the memory element is associated with reference voltage $V_g$. Similarly, a count of errors of the middle page of the read data and the read values of each of the memory elements is sufficient to split the count of errors of the middle page among the reference voltages $V_b$, $V_d$, and $V_f$ and errors in the lower page of the read data are associated with one of $V_a$, and $V_e$ as may be determined through analysis of the read data values. Thus, the controller 108 is operative to determine a count of page errors associated with each of multiple logical pages (e.g., upper page, middle page, lower page) and to split each count of page errors associated with corresponding logical page into a plurality of read point error counts (i.e., each read point error count is associated with a corresponding reference voltage). Each read point error count may correspond to a particular logical page of the multiple logical pages and each read point error may be determined based on page data associated with one or more other logical pages of the multiple logical pages.

Thus, by analyzing the read data 212 and the total error count for each of the upper page, middle page, and lower page of the read data 212, an error count may be associated with each reference voltage ($V_a, \ldots, V_g$). In the example shown in the graph 210, $V_a$ has an associated error count of 60, $V_b$ has an associated error count of 0, $V_c$ has an associated error count of 20, $V_d$ has an associated error count of 30, $V_e$ has an associated error count of 30, $V_f$ has an associated error count of 20, and $V_g$ has an associated error count of 60. For each reference voltage, the associated error count may be determined as a sum of error counts represented by the area of each portion of the histogram curve extending beyond the line represented by the reference voltage. For instance, considering $V_a$ 122, the error count contributed by curve 142 is represented by the portion of curve 142 that is to the right of $V_a$ 122 and the error count contributed by curve 144 is represented by the portion of curve 144 that is to the left of $V_a$ 122. The error count associated with $V_a$ 122 is the sum of the error contributions from curves 142 and 144.

A first iteration of updating the reference voltage $V_a$ 122 is described using graph 220. The graph 220 includes a portion of graph 210 and depicts curves 142 and 144, reference voltage $V_a$ 122, a first alternate reference voltage $V_{a-left}$ 272, and a second alternate reference voltage $V_{a-right}$ 274. The first alternate reference voltage $V_{a-left}$ 272 has been calculated by subtracting a voltage increment $\Delta V$ from the reference voltage $V_a$ 122. The second alternate reference voltage $V_{a-right}$ 274 has been calculated by adding the voltage increment $\Delta V$ to the reference voltage $V_a$ 122. However, in other embodiments, the first alternate reference voltage may be calculated by subtracting, from the reference voltage $V_a$ 122, another voltage increment that is different than the voltage increment $\Delta V$ added to the reference voltage $V_a$ 122 to determine the second alternate reference voltage $V_{a-right}$ 274.

The first alternate reference voltage $V_{a-left}$ 272, when used to read data stored in the memory elements, typically results in an associated error count that differs from the error count associated with the reference voltage $V_a$ 122. Because the first alternate reference voltage $V_{a-left}$ 272 is closer than the reference voltage $V_a$ 122 to the intersection of curves 142 and 144, a first alternate error count associated with the first alternate reference voltage $V_{a-left}$ 272 is expected to be smaller than the error count associated with the reference voltage $V_a$ 122. The second alternate reference voltage $V_{a-right}$ 274 is further than the reference voltage $V_a$ 122 from the intersection of the curves 142 and 144, and therefore a second alternate error count associated with the second alternate reference voltage $V_{a-right}$ 274 is expected to be larger than the error count associated with the reference voltage $V_a$ 122.

An updated reference voltage may be selected based on a comparison of the error counts associated with each of the reference voltage $V_a$ 122, the first alternate reference voltage $V_{a-left}$ 272, and the second alternate reference voltage $V_{a-right}$ 274. For example, the updated reference voltage may be selected to be the first alternate reference voltage $V_{a-left}$ 272 based on the comparison of the error counts associated with each of $V_{a-left}$ 272, $V_a$ 122, and $V_{a-right}$ 274. The reference voltage $V_a$ 122 may be reset to the updated reference voltage $V_{a-left}$ 272, and the updated reference voltage is referred to as $V_a$ 272. After updating, the error count associated with the reference voltage $V_a$ 272 is smaller than the error count associated with $V_a$ 122.

A second iteration of selecting the updated reference voltage may be carried out based on the reference voltage $V_a$ 272 that was previously updated from $V_a$ 122. Graph 230 includes curves 142, 144, the reference voltage $V_a$ 272, a first alternate reference voltage $V_{a-left}$ 276, and a second alternate reference voltage $V_{a-right}$ 278. A voltage increment used to calculate $V_{a-left}$ 276 and $V_{a-right}$ 278 is $\Delta V/2$, i.e., one-half of the voltage increment $\Delta V$ of graph 220. The first alternate reference voltage $V_{a-left}$ 276 is calculated by subtracting the voltage increment $\Delta V/2$ from the reference voltage $V_a$ 272. The second alternate reference voltage $V_{a\text{-}right}$ 278 is calculated by adding the voltage increment $\Delta V/2$ to the reference voltage $V_a$ 272. Because the second alternate reference voltage $V_{a\text{-}right}$ 278 is closer to the intersection of curves 142 and 144 than either of the reference voltage $V_a$ 272 or the first alternate reference voltage $V_{a\text{-}left}$ 276, a second alternate error count associated with the second alternate reference voltage $V_{a\text{-}right}$ 278 is expected to be smaller than the error counts associated with each of the reference voltage $V_a$ 272 and the first alternate reference voltage $V_{a\text{-}left}$ 276. An updated reference voltage may be selected to be the second alternate reference voltage $V_{a\text{-}right}$ 278 based on the comparison of the error counts associated with each of $V_{a\text{-}left}$ 276, $V_a$ 272, $V_{a\text{-}right}$ 278. The reference voltage $V_a$ 272 may be reset to the updated reference voltage $V_{a\text{-}right}$ 278 and is referred to as $V_a$ 278. The error count associated with the (updated) reference voltage $V_a$ 278 is smaller than the error count associated with $V_a$ 272.

A third iteration of selecting the updated reference voltage may be carried out based on the reference voltage $V_a$ 278 (previously updated from $V_a$ 272). Graph 240 depicts a magnified version of graph 230 and includes curves 142, 144, the reference voltage $V_a$ 278, a first alternate reference voltage $V_{a\text{-}left}$ 280, and a second alternate reference voltage $V_{a\text{-}right}$ 282. A voltage increment used to calculate $V_{a\text{-}left}$ 280 and $V_{a\text{-}right}$ 282 is $\Delta V/2^2$, i.e., $\Delta V/4$, one-half of the voltage increment $\Delta V/2$ of graph 230. Because the reference voltage $V_a$ 278 is closer to the intersection of curves 142 and 144 than either the first alternate reference voltage $V_{a\text{-}left}$ 280 or the second alternate reference voltage $V_{a\text{-}right}$ 282, the error count associated with the reference voltage $V_a$ 278 is expected to be smaller than the error counts associated with each of the first alternate reference voltage $V_{a\text{-}left}$ 280 and the second alternate reference voltage $V_{a\text{-}right}$ 282. An updated reference voltage may be selected to be the reference voltage $V_a$ 278 based on the comparison of the error counts associated with each of $V_{a\text{-}left}$ 280, $V_a$ 278, and $V_{a\text{-}right}$ 282. The updated reference voltage $V_a$ remains at its value $V_a$ 278.

A fourth iteration of selecting the updated reference voltage may be carried out based on the reference voltage $V_a$ 278. Graph 250 depicts curves 142, 144, the reference voltage $V_a$ 278, a first alternate reference voltage $V_{a\text{-}left}$ 284, and a second alternate reference voltage $V_{a\text{-}right}$ 286. A voltage increment used to calculate $V_{a\text{-}left}$ 284 and $V_{a\text{-}right}$ 286 is $\Delta V/2^3$, i.e., $\Delta V/8$, one-half of the voltage increment $\Delta V/2^2$ of graph 240. Because the reference voltage $V_a$ 278 is closer to the intersection of curves 142 and 144 than the first alternate reference voltage $V_{a\text{-}left}$ 284 and the second alternate reference voltage $V_{a\text{-}right}$ 286, the error count associated with the reference voltage $V_a$ 278 is expected to be smaller than the error counts associated with either the first alternate reference voltage $V_{a\text{-}left}$ 284 or the second alternate reference voltage $V_{a\text{-}right}$ 286. An updated reference voltage may be selected to be the reference voltage $V_a$ 278 based on the comparison of the error counts associated with each of $V_{a\text{-}left}$ 284, $V_a$ 278, and $V_{a\text{-}right}$ 286. The updated reference voltage $V_a$ remains at its value $V_a$ 278 prior to updating.

A fifth iteration of selecting the updated reference voltage may be carried out based on the reference voltage $V_a$ 278. Graph 260 depicts curves 142, 144, the reference voltage $V_a$ 278, a first alternate reference voltage $V_{a\text{-}left}$ 288, and a second alternate reference voltage $V_{a\text{-}right}$ 290. A voltage increment used to calculate $V_{a\text{-}left}$ 288 and $V_{a\text{-}right}$ 290 is $\Delta V/2^4$, i.e., $\Delta V/16$, one-half of the voltage increment $\Delta V/2^3$ of graph 250. Because the first alternate reference voltage $V_{a\text{-}left}$ 288 is closer to the intersection of curves 142 and 144 than the reference voltage $V_a$ 278 and the second alternate reference voltage $V_{a\text{-}right}$ 290, the error count associated with the first alternate reference voltage $V_{a\text{-}left}$ 288 is expected to be smaller than the error counts associated with each of the reference voltage $V_a$ 278 and the second alternate reference voltage $V_{a\text{-}right}$ 290. An updated reference voltage may be selected to be the first alternative reference voltage $V_{a\text{-}left}$ 288 based on the comparison of the error counts associated with each of $V_{a\text{-}left}$ 288, $V_a$ 278, and $V_{a\text{-}right}$ 290. The reference voltage $V_a$ may be reset to a value equal to the first alternative reference voltage $V_{a\text{-}left}$ 288 and after resetting, the reference voltage $V_a$ becomes $V_a$ 288. The error count associated with the reference voltage $V_a$ 288 is smaller than the error count associated with the reference voltage $V_a$ 278 of the previous iteration.

A sixth iteration of selecting the updated reference voltage may be carried out based on the reference voltage $V_a$ 288. Graph 270 depicts curves 142, 144, the reference voltage $V_a$ 288, a first alternate reference voltage $V_{a\text{-}left}$ 292, and a second alternate reference voltage $V_{a\text{-}right}$ 294. A voltage increment used to calculate $V_{a\text{-}left}$ 292 and $V_{a\text{-}right}$ 294 is $\Delta V/2^5$, i.e., $\Delta V/32$, one-half of the voltage increment $\Delta V/2^4$ of graph 260. The second alternate reference voltage $V_{a\text{-}right}$ 294 is closer to the intersection of curves 142 and 144 than the reference voltage $V_a$ 288 and the first alternate reference voltage $V_{a\text{-}left}$ 292, and therefore the error count associated with the second alternate reference voltage $V_{a\text{-}right}$ 294 is expected to be smaller than the error counts associated with each of the reference voltage $V_a$ 288 and the first alternate reference voltage $V_{a\text{-}left}$ 292. An updated reference voltage may be selected to be the second alternative reference voltage $V_{a\text{-}right}$ 294 based on the comparison of the error counts associated with each of $V_{a\text{-}left}$ 292, $V_a$ 288, and $V_{a\text{-}right}$ 294. The reference voltage $V_a$ may be reset to the second alternative reference voltage $V_{a\text{-}right}$ 294 and after resetting, the reference voltage becomes $V_a$ 294. The error count associated with the reference voltage $V_a$ 294 is smaller than the error count associated with $V_a$ 288. After completing six update iterations the error count (=45) associated with the reference voltage $V_a$ 288 is smaller than the error count (=60) associated with the initial reference voltage $V_a$ 122. Thus, updating the reference voltage by successive iterations can reduce the error count associated with the reference voltage.

In each of the iterations described, the voltage increment is half of the previous iteration, resulting in a fine tuning of the selected updated reference voltage. By carrying out multiple iterations, the update of the reference voltage $V_a$ may be fine-tuned to reduce read errors. A smallest voltage increment may be selected or may result from an implementation-specific characteristic, and therefore a finite number of iterations may be performed to fine-tune the selection of the updated reference voltage to a resolution corresponding to the smallest voltage increment.

Although selection of an updated reference voltage is described for clarity of explanation as based on a comparison of explicitly determined error counts associated with alternative reference voltages (e.g. the first alternate reference voltage $V_{a\text{-}left}$ 272 and the second alternate reference voltage $V_{a\text{-}right}$ 274), in some circumstances selection of an updated reference voltage may not be based on a comparison of explicitly determined error counts. For example, if reading the data during the first iteration using the second alternate reference voltage $V_{a\text{-}right}$ 274 causes the data to be uncorrectable (i.e. a number of errors occurring in the data exceeds a correction capacity of the ECC encoding scheme), an error count corresponding to the second alternate reference voltage $V_{a\text{-}right}$ 274 may not be explicitly determined. In this case, selection of the updated reference voltage may be based on a comparison between explicitly determined error counts associated with the first alternate reference voltage $V_{a\text{-}left}$ 272, $V_a$ 122, and an error count associated with $V_{a\text{-}right}$ 274 that may be set to a value that exceeds the smaller of the error counts associated with $V_{a\text{-}left}$ 272 and $V_a$ 122. Continuing the example, if both the first alternate reference voltage $V_{a\text{-}left}$ 272 and the second alternate reference voltage $V_{a\text{-}right}$ 274 result in uncorrectable data, the comparison of error counts performed during the first iteration determines the center voltage ($V_a$ 122) as having the smallest error count, resulting in the center voltage ($V_a$ 122) being selected as the updated reference voltage and the next iteration being initiated using a smaller voltage increment.

Reference voltage updating may be carried out for each reference voltage $V_a, V_b, V_c, \ldots V_g$. The resulting set of updated reference voltages may be result in a reduced error count associated with reading the data stored in the memory elements.

Figure 3:
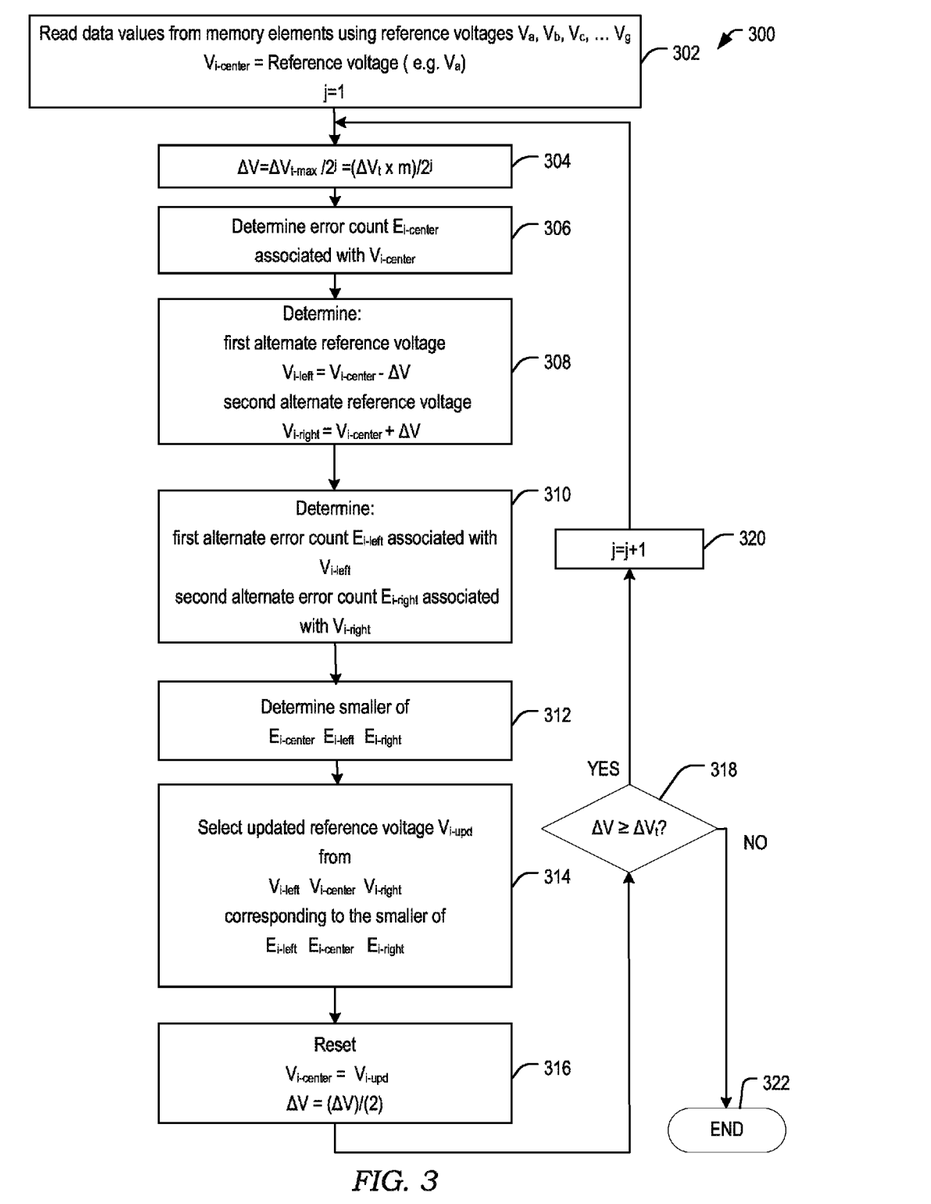
FIG. 3 is a flow diagram illustrating a particular embodiment of a method of updating a reference voltage based on a comparison of read error counts associated with each of a reference voltage, a first alternate reference voltage, and a second alternate reference voltage.

FIG. 3 is a flow diagram illustrating a particular embodiment of a method of updating a reference voltage based on a comparison of error counts. Data values are read from a group of memory elements using the reference voltages ($V_a, V_b, V_c, \ldots V_g$) at 302. For example, the group of memory elements may be the group of memory elements 107 in the non-volatile memory 106 of FIG. 1, such as a flash memory. A reference voltage $V_{i\text{-}center}$ is initialized to a selected reference voltage, (i.e., one of the reference voltages $V_a, V_b, V_c, \ldots V_g$ of FIG. 1) and an iteration index j is initialized to a value of one, at 302.

A voltage increment ($\Delta V$) is set at one-half of a maximum voltage $V_{t\text{-}max}$, at 304. The maximum voltage $V_{t\text{-}max}$ may be an integer multiple "m" times a smallest incremental voltage "$\Delta V_t$".

An error count $E_{i\text{-}center}$ associated with $V_{i\text{-}center}$ may be determined based on data values read from the group of memory elements, at 306. Errors in the read data values may be identified by an ECC decoder, such as the ECC decoder 114 of FIG. 1. The data values may be read from multiple logical pages, each logical page being decoded by the ECC decoder 114 of FIG. 1. Errors may be determined by the ECC decoder 114 in response to satisfaction of a condition, e.g., after each logical page of data is read, after a block of data that includes multiple logical pages is read, when an expected movement in one or more of the reference voltages exceeds a threshold value, e.g., X millivolts, after a defined number of reads and/or writes to the memory 106, when a count of read errors exceeds a threshold error count, in response to another condition, or any combination thereof. To illustrate, the error count $E_{i\text{-}center}$ may correspond to errors associated with $V_a$ of FIG. 2 (i.e., error count of 60).

A first alternate reference voltage $V_{i\text{-}left}$ and a second alternate reference voltage $V_{i\text{-}right}$ are determined based on the reference voltage $V_{i\text{-}center}$ and based on the voltage increment $\Delta V$, at 308. A first alternate error count $E_{i\text{-}left}$ and a second alternate error count $E_{i\text{-}right}$ are determined, at 310. For example, the first alternate error count ($E_{i\text{-}left}$) that is associated with the first alternate reference voltage may be determined from first alternate data values that are read from memory elements of a data storage device using the first alternate reference voltage $V_{i\text{-}left}$. The second alternate error count ($E_{i\text{-}right}$) that is associated with the second alternate reference voltage $V_{i\text{-}right}$ may be determined from second alternate data values that are read from the memory elements using the second alternate reference voltage $V_{i\text{-}right}$. For example, $E_{i\text{-}left}$ and $E_{i\text{-}right}$ may be determined by reading all three pages using $V_{i\text{-}left}$ (i=a, b, ... g), reading all three pages using $V_{i\text{-}right}$ (i=a, b, ... g), using the ECC engine 110 to obtain error information, and using the mapping of bits to states 160 of FIG. 1 to assign the errors to particular reference voltages.

The smallest of $E_{i\text{-}center}, E_{i\text{-}left}$, and $E_{i\text{-}right}$ is determined, at 312. An updated reference voltage $V_{i\text{-}upd}$ is selected to be one of $V_{i\text{-}center}, V_{i\text{-}left}$, and $V_{i\text{-}right}$ based on values of associated error counts $E_{i\text{-}center}, E_{i\text{-}left}$, and $E_{i\text{-}right}$, at 314. For example, in FIG. 2, the error count associated with a reference voltage in close proximity to the intersection of curves 142 and 144 is expected to be lower than for another voltage that is further from the intersection of curves 142 and 144.

The reference voltage $V_{i\text{-}center}$ is reset to the updated reference voltage and the voltage increment $\Delta V$ is reset to one-half its value ($\Delta V/2$), at 316. A determination is made as to whether, after resetting, the voltage increment $\Delta V$ is greater than or equal to $\Delta V_t$, (e.g., $\Delta V_t$ is a smallest voltage increment detectable by the controller 108 of FIG. 1), at 318. If the voltage increment $\Delta V$ is greater than or equal to $\Delta V_t$, the iteration index j is increased by 1, at 320, and the method returns to 304 to perform another iteration. If the voltage increment $\Delta V$ is less than $\Delta V_t$, the method ends at 322.

In another embodiment, iterating may continue until a change between error counts associated with an updated reference voltage and a next updated reference voltage is smaller than a threshold error count. In a particular example, if the error count associated with an updated reference voltage is equal to the error count associated with the next updated reference voltage, the iteration process is halted. As another example, a predetermined number of iterations may be performed.

By selecting each updated reference voltage during each iteration based on a comparison of associated error counts of the reference voltage and one or more alternate reference voltages, a total number of errors associated with reading data stored in memory may be reduced when reading data using the updated set of reference voltages. Updating the set of reference voltages can be accomplished during operation of a data storage device, e.g., in response to completing a defined number of read/write cycles (i.e., a cycle count exceeding a cycle count threshold), in response to an indication that an expected movement in reference voltages exceeds a threshold value, in response to a periodic or aperiodic analysis of error counts, e.g., an error count exceeding an error count threshold, or in response to another indicator. Updating the set of reference voltages may include, after updating the reference voltage (e.g., in a previous iteration), selecting another updated reference voltage as one of an additional updated reference voltage, an additional first alternate reference voltage and an additional second alternate reference voltage, where the additional first alternate reference voltage and the additional second alternate reference voltage are determined based on the additional updated reference voltage and based on an additional voltage increment (e.g., the additional voltage increment is smaller than the voltage increment used in the previous iteration). Selection of the other updated reference voltage may be based on a comparison of additional error counts, each additional error count associated with a unique one of the additional reference voltage, the additional first alternate reference voltage, and the additional second alternate reference voltage. Updating the set of reference voltages may also include resetting the updated reference voltage to the other updated reference voltage and resetting the additional voltage increment to a different voltage increment that is smaller than the additional voltage increment.

Updating the set of reference voltages, either periodically or aperiodically during the life of the memory, can be advantageous in that the updating may compensate for increases in error counts due to changes in the threshold voltages of some of the memory elements "on the fly." Reducing errors in data read from memory may extend the useful life of the memory and may result in reduced read latency.

Figure 4:
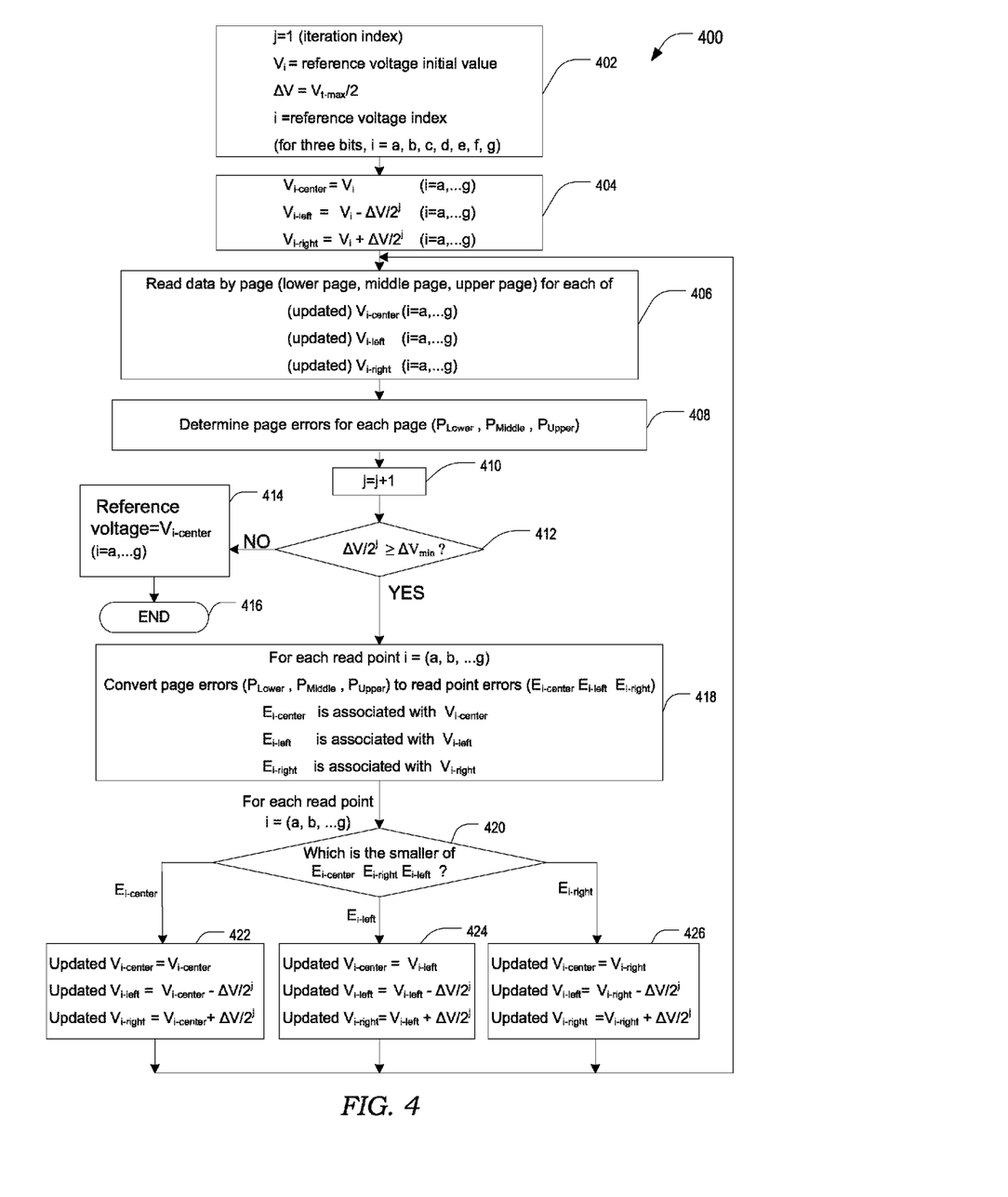
FIG. 4 is a flow diagram illustrating a particular embodiment of a method of updating reference voltages based on a comparison of read error counts.

FIG. 4 is a flow diagram illustrating another particular embodiment of a method of updating one or more reference voltages based on a comparison of error counts, and is generally designated 400. An iteration index j is set to a value of 1 for a reference voltage with a reference voltage initial value $V_i$ (e.g., i=a), and an initial voltage increment $\Delta V$ is set at one-half of a maximum voltage increment $V_{t\text{-}max}$, at 402. A center reference voltage $V_{i\text{-}center}$ is set equal to the reference voltage initial value $V_{15}$ first alternate reference voltage $V_{i\text{-}left}$ is set to a value of $V_i - \Delta V/2^j$, and a second alternate reference voltage $V_{i\text{-}right}$ is set to a value of $V_i + \Delta V/2^j$, at 404.

Three pages of data (lower, middle, upper) are read using a set of reference voltages $V_i$ (i=a, b, c, ... g), at 406. The three pages of data are also read using a set of first alternative reference voltages $V_{i\text{-}left}$ (i=a, b, c, ... g), at 406. The three pages of data are also read using a set of second alternative reference voltages $V_{i\text{-}right}$ (i=a, b, c, ... g), at 406.

ECC decoding is performed to find page errors ($P_{Lower}$, $P_{Middle}$, and $P_{Upper}$) associated with the set of reference voltages $V_i$ (i=a, b, c, ... g), at 408. ECC decoding is performed to find page errors ($P_{Lower}$, $P_{Middle}$, and $P_{Upper}$) associated with the set of first alternate reference voltages $V_{i\text{-}left}$ (i=a, b, c, ... g), at 408. ECC decoding is performed to find page errors ($P_{Lower}$, $P_{Middle}$, and $P_{Upper}$) associated with the set of second alternate reference voltages $V_{i\text{-}right}$ (i=a, b, c, ... g), at 408. The page errors may be determined by an ECC decoder such as the ECC decoder 114 of FIG. 1.

The index j is increased by 1, at 410. A determination of whether $\Delta V/2^j$ is greater than or equal to 1 is made, at 412. If $\Delta V/2^j$ is less than a smallest incremental voltage step $\Delta V_{min}$, the reference voltage of each reference point (i=a, b, c, ... g) remains at the previous iteration value $V_{i\text{-}center}$ corresponding to the reference voltage determined to have the fewest read point errors in the previous iteration, at 414, and the method ends at 416. If $\Delta V/2^j$ is greater than $\Delta V_{min}$, each of the page errors is converted to read point errors $E_{i\text{-}center}$, for each of the reference points i=(a, b, ... g), with each read point error associated with a particular reference voltage $V_{i\text{-}center}$, i=(a, b, ... g). For example, each page may be read using the set of reference voltages $V_{i\text{-}center}$ (i=a, b, ... g) and the errors may be separated into $E_{a\text{-}center}$ associated with $V_{a\text{-}center}$, $E_{b\text{-}center}$ associated with $V_{b\text{-}center}$, etc. using the mapping of bits to states 160 of FIG. 1. Each page may also be read using $V_{i\text{-}left}$ (i=a, b, ... g) and the page errors may be separated into $E_{i\text{-}left}$, i=(a, b, ... g). Each page may be read using $V_{i\text{-}right}$ (i=a, b, ... g) and the errors may be separated into $E_{i\text{-}right}$, i=(a, b, ... g).

Considering each read point i, a smallest of the error counts (also called read point errors) $E_{i\text{-}center}$, $E_{i\text{-}left}$, $E_{i\text{-}right}$ (associated with $V_{i\text{-}center}$, and $V_{i\text{-}right}$ respectively) is identified, at 420. The reference voltage corresponding to the smallest of ($E_{a\text{-}center}$, $E_{a\text{-}right}$, $E_{a\text{-}left}$) is selected to be the updated reference voltage. For example, when the smallest of ($E_{i\text{-}center}$, $E_{i\text{-}right}$, $E_{i\text{-}left}$) is $E_{i\text{-}center}$, the updated reference voltage remains $V_{i\text{-}center}$ at 422.

When the smallest error count is $E_{i\text{-}left}$, the updated reference voltage is set to $V_{i\text{-}left}$, an updated $V_{i\text{-}left}$ is set to $V_{i\text{-}left} - \Delta V/2^j$, and an updated $V_{i\text{-}right}$ is set to $V_{i\text{-}left} + \Delta V/2^j$, at 424. When the smallest error count is $E_{i\text{-}right}$, the updated reference voltage is set to $V_{i\text{-}right}$, at 426, an updated $V_{i\text{-}left}$ is set to $V_{i\text{-}right} - \Delta V/2^j$, and an updated $V_{i\text{-}right}$ is set to $V_{i\text{-}right} + \Delta V/2^j$, at 426. Returning to 408, a next iteration of updating the reference voltage is performed.

Although the methods depicted in FIGS. 3 and 4 decrease the voltage increment by powers of 2, i.e., $2^j$, (j=1, 2, ...), in other embodiments, the voltage increment may be decreased by other amounts. Additionally, in some embodiments, the initial voltage increment $V_{t\text{-}max}$ may change over time.

In an example, after updating each of the reference voltages, the set of updated reference voltages may be stored in the memory 106 of FIG. 1 and may replace a previously stored set of reference voltages 116. The updated set of reference voltages stored in the controller 108 may be used to read the data values stored in the memory 106 of FIG. 1. For instance, the updated set of reference voltages may be sent from the controller 108 to the memory 106 and may be stored in the memory 108, where the updated set of reference voltages is available for reading the stored data values in the group of memory elements 107.

The method 400 may be used to reduce error counts of read data. By selecting each updated reference voltage based on a comparison of associated error counts, a total number of errors associated with reading data stored in memory may be reduced. Iterating the updating of the reference voltages to fine-tune the values of the updated reference voltages results in a reduction in the total number of errors associated with reading data stored in the memory. An additional advantage of reducing the error count may be a reduction in the load of the ECC decoder, which may result in faster data reads.

Figure 5:
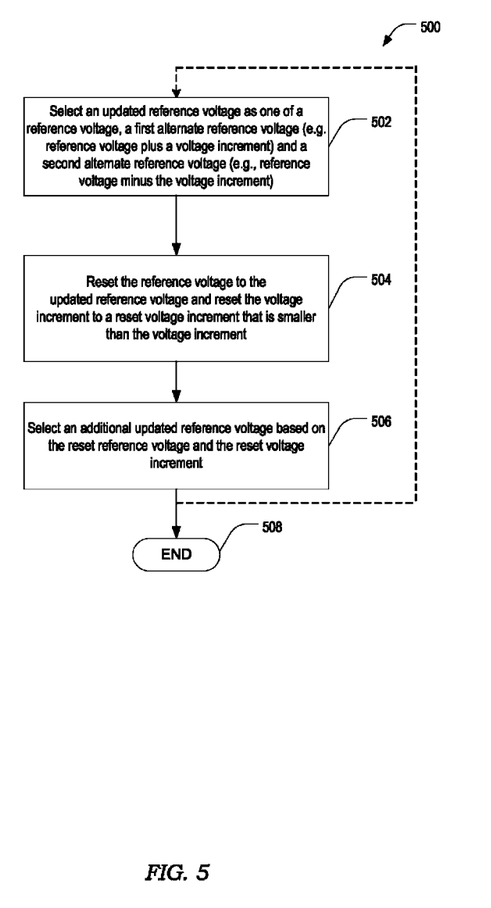
FIG. 5 is a flow diagram illustrating another particular embodiment of a method of updating reference voltages based on a comparison of read error counts.

FIG. 5 is a flow diagram 500 illustrating a particular embodiment of a method of updating a reference voltage based on a comparison of error counts. An updated reference voltage may be selected as one of a reference voltage, a first alternate reference voltage (e.g., the reference voltage plus a voltage increment), and a second alternate reference voltage (e.g., the reference voltage minus the voltage increment), at 502. The reference voltage may be reset to the updated reference voltage, and the voltage increment may be reset to a voltage increment that is smaller than the voltage increment, at 504. An additional updated reference voltage may be selected based on the reset reference voltage and the reset voltage increment, at 506. Optionally, the method may return to 502 to perform another iteration to refine the updated reference voltage. The method ends at 508. The method 500 may be carried out by the iterative error comparison and reference voltage selection engine 118 of FIG. 1.

The method 500 may be used to reduce error counts of read data. By selecting each updated reference voltage based on a comparison of associated error counts, a total number of errors associated with reading data stored in memory may be reduced. Using an iterative technique to fine-tune each reference voltage may further reduce the total number of errors associated with reading the stored data, each iteration resulting in corresponding total error count that is less than the total error count associated with the previous iteration.

Although various components depicted herein are illustrated as block components and described in general terms, such components may include one or more microprocessors, state machines, or other circuits configured to enable a data storage device, such as the data storage device 104 of FIG. 1, to perform the particular functions attributed to such components. For example, the iterative error comparison and reference voltage selection engine 118 of FIG. 1 may represent physical components, such as controllers, processors, state machines, logic circuits, or other structures to create an updated set of reference voltages.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device that includes a non-volatile memory, performing:
selecting an updated reference voltage as one of a reference voltage, a first alternate reference voltage, and a second alternate reference voltage,
wherein the first alternate reference voltage and the second alternate reference voltage are determined based on the reference voltage and based on a voltage increment, and
wherein selection of the updated reference voltage is based on a comparison of error counts, each error count associated with a unique one of the reference voltage, the first alternate reference voltage, and the second alternate reference voltage;
resetting the reference voltage to the updated reference voltage and resetting the voltage increment to a reset voltage increment that is smaller than the voltage increment; and
after resetting the reference voltage and the voltage increment, selecting an additional updated reference voltage based on the reset reference voltage and based on the reset voltage increment.

2. The method of claim 1, wherein an error count associated with the reference voltage is based on errors that are detected in data values that are read from memory elements of the non-volatile memory using the reference voltage.

3. The method of claim 2, wherein the errors are detected by an error correction code (ECC) decoder.

4. The method of claim 2, wherein the data values are read from multiple logical pages, each logical page decoded at an error correction code (ECC) decoder.

5. The method of claim 4, wherein the error count associated with the reference voltage is determined by:
determining a corresponding count of page errors associated with each of the multiple logical pages; and
for each count of page errors, splitting the count of page errors into a plurality of read point error counts, each read point error count associated with a corresponding one of a plurality of reference voltages;
selecting, from the plurality of read point error counts, the read point error count associated with the reference voltage.

6. The method of claim 5, wherein each read point error count is associated with a particular logical page of the multiple logical pages and is determined based on page data associated with one or more logical pages of the multiple logical pages other than the particular logical page.

7. The method of claim 2, wherein each memory element stores a plurality of bits.

8. The method of claim 2, further comprising performing selecting the updated reference voltage, resetting, and selecting at least one additional updated reference voltage in response to a determination of one of a count of write/erase cycles of the memory elements exceeding a cycle count threshold, an indication that an expected movement in a particular reference voltage exceeds a threshold value, and a count of read errors exceeding an error count threshold.

9. The method of claim 8, further comprising, after selecting at least one additional updated reference voltage and in response to a next determination of one of another count of the number of write/erase cycles of the memory elements exceeding the cycle count threshold, another indication that the expected movement in the reference voltage exceeds the threshold value, or another instance of the error count of read errors exceeding the error count threshold:
selecting another updated reference voltage as one of the additional updated reference voltage, an additional first alternate reference voltage and an additional second alternate reference voltage,
wherein the additional first alternate reference voltage and the additional second alternate reference voltage are determined based on the additional updated reference voltage and based on an additional voltage increment, and
wherein selection of the other updated reference voltage is based on a comparison of additional error counts, each additional error count associated with a unique one of the additional reference voltage, the additional first alternate reference voltage, and the additional second alternate reference voltage; and
resetting the updated reference voltage to the other updated reference voltage and resetting the additional voltage increment to a different voltage increment that is smaller than the additional voltage increment.

10. The method of claim 1, wherein the non-volatile memory is a flash memory.

11. The method of claim 1, wherein the reset voltage increment is approximately half of the voltage increment.

12. The method of claim 1, wherein the first alternate reference voltage is determined by subtracting the voltage increment from the reference voltage and the second alternate reference voltage is determined by adding the voltage increment to the reference voltage.

13. The method of claim 1, wherein a first alternate error count that is associated with the first alternate reference voltage is determined from first alternate data values that are read from at least some of the memory elements using the first alternate reference voltage and a second alternate error count that is associated with the second alternate reference voltage is determined from second alternate data values that are read from at least some of the memory elements using the second alternate reference voltage.

14. The method of claim 1, wherein in response to the reset voltage increment having a value less than a voltage increment threshold, setting the additional updated reference voltage equal to the updated reference voltage.

15. A data storage device comprising:
a controller, the controller configured to:
select an updated reference voltage as one of a reference voltage, a first alternate reference voltage and a second alternate reference voltage,
wherein the first alternate reference voltage and the second alternate reference voltage are determined based on the reference voltage and based on a voltage increment, and
wherein the selection of the updated reference voltage is based on a comparison of error counts, each error count associated with a unique one of the reference voltage, the first alternate reference voltage, and the second alternate reference voltage; and wherein the selection includes identifying one of the error counts that is less than each other of the error counts and selecting the associated one of the reference voltage, the first alternate reference voltage, and the second alternate reference voltage as the updated reference voltage;

reset the reference voltage to equal the updated reference voltage and reset the voltage increment to another voltage increment that is smaller than the voltage increment; and after resetting the reference voltage and the voltage increment, select an additional updated reference voltage based on the reset reference voltage and the reset voltage increment; and a non-volatile memory including a plurality of memory elements, wherein the non-volatile memory is configured to store the updated reference voltage among a set of updated reference voltages.

16. The data storage device of claim 15, further comprising an error correction code (ECC) decoder, the ECC decoder configured to identify errors associated with each of the error counts.

17. The data storage device of claim 15, wherein the controller is further configured to determine a first error count of the error counts, the first error count associated with the reference voltage based on reading data stored in the non-volatile memory using the reference voltage.

18. The data storage device of claim 17, wherein the data is read as multiple logical pages.

19. The data storage device of claim 18, wherein the controller is further configured to:
    determine a count of page errors associated with each of the multiple logical pages; and
    split each count of page errors into a corresponding plurality of read point error counts, wherein each read point error count corresponds to a particular logical page of the multiple logical pages and is determined based on page data associated with one or more other logical pages of the multiple logical pages.

20. The data storage device of claim 15, wherein in response to one of a count of write/erase cycles of the memory elements exceeding a cycle count threshold, an indication that a change in a particular reference voltage exceeds a threshold value, and a count of read errors exceeding an error count threshold, the controller is configured to:
    select another updated reference voltage as one of the additional updated reference voltage, an additional first alternate reference voltage and an additional second alternate reference voltage,
        wherein the additional first alternate reference voltage and the additional second alternate reference voltage are determined based on the additional updated reference voltage and based on an additional voltage increment, and
        wherein selection of the other updated reference voltage is based on a comparison of additional error counts, each additional error count associated with a unique one of the additional reference voltage, the additional first alternate reference voltage, and the additional second alternate reference voltage; and
    reset the updated reference voltage to the other updated reference voltage and resetting the additional voltage increment to a different voltage increment that is smaller than the additional voltage increment.

21. A data storage device comprising:
a non-volatile memory; and
a controller, the controller configured to:
    determine a read point error count associated with a reference voltage, the read point error count associated with data read from memory storage elements of the non-volatile memory; and
    iteratively reset the reference voltage, in a plurality of iterations, wherein each reset reference voltage is associated with an updated read point error count and is selected based on read point error counts of multiple candidate reference voltages, and wherein a voltage range of the multiple candidate reference voltages decreases with each successive iteration;
an error correction code (ECC) decoder, wherein the data corresponds to multiple logical pages, and wherein each logical page of the multiple logical pages is decoded at the ECC decoder,
wherein the read point error count associated with the reference voltage is determined by:
    determining a corresponding count of page errors associated with each of the multiple logical pages;
    for each count of page errors, splitting the count of page errors into a plurality of read point error counts, each of the plurality of read point error counts associated with a corresponding one of a plurality of reference voltages; and
selecting, from the plurality of read point error counts, the read point error count associated with the reference voltage.

22. A method comprising:
in a data storage device that includes a non-volatile memory, performing:
    determining a read point error count associated with a reference voltage, the read point error count associated with data read from the non-volatile memory; and
    iteratively resetting the reference voltage, in a plurality of iterations, wherein each reset reference voltage is associated with an updated read point error count and is selected based on read point error counts of multiple candidate reference voltages, and wherein a voltage range of the multiple candidate reference voltages decreases with each successive iteration;
    wherein the data corresponds to multiple logical pages, and wherein each logical page of the multiple logical pages is decoded at an error correction code (ECC) decoder of the data storage device,
    wherein the read point error count associated with the reference voltage is determined by:
        determining a count of page errors associated with each of the multiple logical pages;
        for each count of page errors, splitting the count of page errors into a plurality of read point error counts, each of the plurality of read point error counts associated with a corresponding one of a plurality of reference voltages; and
        selecting, from the plurality of read point error counts, the read point error count associated with the reference voltage.

23. The method of claim 22, wherein the decrease in the voltage range corresponds to a decrease in a voltage difference between candidate reference voltages of the multiple candidate reference voltages.

* * * * *